(12) United States Patent
Sin et al.

(10) Patent No.: US 9,318,784 B2
(45) Date of Patent: Apr. 19, 2016

(54) ISOLATOR AND ISOLATOR MANUFACTURING METHOD

(71) Applicant: FUJI ELECTRIC CO., LTD., Kawasaki-shi (JP)

(72) Inventors: Johnny Kin-On Sin, Hong Kong (CN); Lulu Peng, Hong Kong (CN); Rongxiang Wu, Hong Kong (CN); Hitoshi Sumida, Matsumoto (JP); Yoshiaki Toyoda, Matsumoto (JP); Masashi Akahane, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 220 days.

(21) Appl. No.: 13/894,624

(22) Filed: May 15, 2013

(65) Prior Publication Data
US 2013/0321094 A1   Dec. 5, 2013

Related U.S. Application Data

(63) Continuation of application No. PCT/JP2012/003512, filed on May 29, 2012.

(51) Int. Cl.
*H04B 3/28* (2006.01)
*H01P 1/36* (2006.01)
(Continued)

(52) U.S. Cl.
CPC ............ *H01P 1/36* (2013.01); *H01L 21/76879* (2013.01); *H01L 23/481* (2013.01);
(Continued)

(58) Field of Classification Search
CPC ............. H03H 2001/0021; H03H 2001/0064; H03H 2001/78; H01F 2017/065
USPC .......................................................... 333/12
See application file for complete search history.

(56) References Cited

U.S. PATENT DOCUMENTS 4,857,482 A * 8/1989 Saito et al. ...................... 29/837
5,519,582 A   5/1996 Matsuzaki
(Continued)

FOREIGN PATENT DOCUMENTS

JP   06-120036 A   4/1994
JP   08-032099 A   2/1996
(Continued)

OTHER PUBLICATIONS

Wang, N., et al, "Thin Film Microtransformer Integrated on Silicon for Signal Isolation" (USA), IEEE Transactions on Magnetics, vol. 43, No. 6, Jun. 2007, pp. 2719-2721. Cited in the specification.
(Continued)

*Primary Examiner* — Robert Pascal
*Assistant Examiner* — Kimberly Glenn
(74) *Attorney, Agent, or Firm* — Rossi, Kimms & McDowell LLP

(57) ABSTRACT

In certain aspects of the invention, an isolator is configured by a reception circuit, a transmission circuit, and a transformer. In some aspects, the transmission circuit is disposed in an anterior surface of a semiconductor substrate. The transformer is disposed in a posterior surface of the semiconductor substrate and transmits in an electrically isolated state to the reception circuit, a signal input from the transmission circuit. The transformer is configured by a primary coil and a secondary coil. The primary coil can be configured by a metal film embedded in an oxide film inside a coil trench. The secondary coil can be disposed inside an insulating film covering the primary coil so as to oppose the primary coil and is insulated from the primary coil by the insulating film.

12 Claims, 18 Drawing Sheets

(51) Int. Cl.

| | | |
|---|---|---|
| *H01L 21/768* | (2006.01) | |
| *H01L 23/522* | (2006.01) | |
| *H01L 23/64* | (2006.01) | |
| *H01L 25/065* | (2006.01) | |
| *H01L 49/02* | (2006.01) | |
| *H01L 23/48* | (2006.01) | |
| *H01F 19/08* | (2006.01) | |
| *H01L 23/00* | (2006.01) | |

(52) U.S. Cl.
CPC .......... *H01L23/5227* (2013.01); *H01L 23/645* (2013.01); *H01L 25/0652* (2013.01); *H01L 25/0657* (2013.01); *H01L 28/10* (2013.01); *H01F 2019/085* (2013.01); *H01L 24/16* (2013.01); *H01L 2224/13022* (2013.01); *H01L 2224/16238* (2013.01); *H01L 2224/73257* (2013.01); *H01L 2225/06513* (2013.01); *H01L 2225/06531* (2013.01); *H01L 2225/06541* (2013.01); *H01L 2924/00014* (2013.01); *H01L 2924/12043* (2013.01); *H01L 2924/13091* (2013.01)

(56) References Cited

U.S. PATENT DOCUMENTS

| | | |
|---|---|---|
| 6,927,662 B2 | 8/2005 | Kahlmann et al. |
| 7,417,301 B2 | 8/2008 | Taghizadeh-Kaschani |
| 7,683,654 B2 | 3/2010 | Chen et al. |
| 8,319,573 B2 * | 11/2012 | Kanschat et al. ........... 333/24 R |
| 2004/0056749 A1 | 3/2004 | Kahlmann et al. |
| 2005/0230837 A1 | 10/2005 | Taghizadeh-Kaschani |
| 2007/0205855 A1 | 9/2007 | Hashimoto |
| 2012/0068301 A1 | 3/2012 | Sin et al. |

FOREIGN PATENT DOCUMENTS

| | | |
|---|---|---|
| JP | 2001-185685 A | 7/2001 |
| JP | 2007-067057 A | 3/2007 |
| JP | 2007-235035 A | 9/2007 |

OTHER PUBLICATIONS

Xu, M., et al, "A Microfabricated Transformer for High-Frequency Power or Signal Conversion" (USA), IEEE Transactions on Magnetics, vol. 34, No. 4, Jul. 1998, pp. 1369-1371. Cited in the specification.

Chen, B., "Isolated Half-Bridge Gate Driver with Integrated High-Side Supply" (Greece), IEEE Power Electronics Specialists Conference (PESC) 2008, Jun. 2008, pp. 3615-3618. Cited in the specification.

Kaeriyama, et al., "A 2.5kV Isolation 35kV/us CMR 250Mbps 0.13mA/Mbps Digital Isolator in Standard CMOS with an on-Chip Small Transformer" (USA), IEEE Symposium on VLSI Circuits (VLSIC) 2010, Jun. 2010, pp. 197-198. Cited in the specification.

Munzer, M., "Coreless Transformer a New Technology for Half Bridge Driver IC's" (Germany), International Exhibition and Conference for Power Electronics, Intelligent Motion and Power Quality (PCIM)), May 2003. Cited in the specification.

Analog Devices, Inc., "Datasheet of ADuM1234 (Analog Devices Application Note)", 2007, pp. 1-10. Cited in the specification.

Infineon Technologies AG, "Datasheet of 2DE020112-FI (Infineon Technologies Application Note)", 2006. Cited in the Specification.

Rongxiang, W., "A Novel Silicon-Embedded Coreless Transformer for Isolated DC-DC Converter Application" (USA), IEEE 23rd International Symposium on Power Semiconductor Devices and ICs (ISPSD) 2011, May 2011, pp. 352-355. Cited in the specification.

* cited by examiner

ISOLATOR AND ISOLATOR MANUFACTURING METHOD

CROSS-REFERENCE TO RELATED APPLICATION

This application is a continuation of International Application No. PCT/JP2012/003512, filed on May 29, 2012. The disclosure of the PCT application, in its entirety, including the drawings, claims, and the specification thereof, is incorporated herein by reference.

BACKGROUND

1. Field of the Invention

The present invention relates to an isolator and isolator manufacturing method.

2. Background Related Art

Various types of apparatuses, such as devices used for industrial or medical purposes, often require electrical insulation. For example, an electronic device controlled by high voltage is equipped with a signal isolator (isolator) so that when a signal received by the electronic device is transmitted to an external device or when the user directly manipulates the operation panel, the user is not subjected to electrical shock or other severe bodily harm. When the electrical potential difference between electronic devices or circuit blocks is large, the isolator has a function of transmitting a signal from the low voltage side to the high voltage side or from the high voltage side to the low voltage side, in an electrically isolated state where large currents are prevented from flowing between the low voltage side and the high voltage side (hereinafter, referred to as isolated transmission).

Meanwhile, even if the electrical potential difference between electronic devices or between circuit blocks is small, an isolator is disposed. For example, when an analog circuit and a digital circuit are connected at a common reference potential, the analog circuit is affected by digital noise. Therefore, by completely separating the reference potentials of the analog circuit and the digital circuit electrically by an isolator, digital noise can be prevented from being introduced at the analog circuit, thereby improving the performance of the signal processor.

Conventionally, photocouplers, which use light at a signal transmitter, are known as very versatile isolators. A photocoupler is configured by a photodiode and a phototransistor combined together as 1 package; where an input electrical signal is converted to light by the photodiode and the light/dark changes of this light are converted to voltage by the phototransistor to thereby perform electrically isolated signal transmission. Photocouplers offer the advantages of a simple package configuration and high electrical isolation performance. On the other hand, photocouplers cannot be fabricated (manufactured) on a semiconductor substrate by a general integrated circuit (IC) process. Consequently, photocouplers cannot be integrated with transmission circuits nor with reception circuits and are disposed as a separate component in a signal processor, making size reductions of signal processors difficult.

Further, the luminous efficiency of photodiodes temporally degrades consequent to operating conditions such as operating temperature and forward current. As a result, when the life expectancy of a photodiode-equipped device is of importance, the setting of conditions such as operating temperature and forward current must be carefully considered. In addition, the photocoupler has a slow response speed requiring periods on the order of microseconds for signal transmission. As a result, for example, an inverter drive circuit equipped with a photocoupler has to establish dead time on the order of microseconds for the device configured by the inverter and thus, increases in speed are not possible.

Next to photocouplers, coupling capacitors that use field variations consequent to capacitive coupling at the signal transmitter are known as isolators of high versatility. Coupling capacitors block direct current (DC) signals from the transmission circuit and transmit only alternating current (AC) signals to the reception circuit. Thus, coupling capacitors are effective when separating direct voltage settings of a circuit network between the transmission circuit and the reception circuit.

Further, coupling capacitors offer the advantages of high insulation resistance and low power consumption. Nonetheless, coupling capacitors have a problem of being easily affected by noise and external electric fields.

Transformers that use magnetic field variations based on inductive coupling with the signal transmitter are additionally known as isolators. Such transformers, in general, have a configuration in which a magnetic body of, for example, ferrite is disposed between 2 coils. However, despite having high insulation resistance and high resistance to noise, these transformers further have a high cost and high power consumption. Furthermore, since the coils in the transformers are large, a reduction in the size of the transformer is difficult. Like photocouplers, the coupling capacitors and the transformers are also equipped in signal processors as a separate component, making a reduction in the size of the signal processor difficult. Thus, with respect to a signal processor equipped with a photocoupler, a coupling capacitor, or a transformer, a problem arises in that reductions in the size of the signal processor become difficult.

A high voltage IC (HVIC) is known as a signal processor to address such problems. An HVIC can perform, via a level shift circuit, signal transmission between circuits having power sources of differing electric potentials and can be integrated with a transmission circuit and a reception circuit by general IC processing.

Consequently, reductions in cost, power consumption, and size can be facilitated. However, since the HVIC cannot perform isolated transmission of signals, tolerability of high voltages is difficult to facilitate, e.g., a voltage tolerance of a mere 1200V can be guaranteed. Further, since the HVIC has a low tolerance to noise and is easily damaged, the HVIC is not applicable to devices for which reliability is required.

Therefore, an isolator that can be integrated with a transmission circuit and a reception circuit onto the same semiconductor substrate by general IC processing, and that can perform isolated transmission of signals is demanded. Digital isolators are known as such an isolator. A digital isolator has a transformer that by a series of IC processes for fabricating a signal processor, is integrated with a transmission circuit and a reception circuit, and performs signal transmission using magnetic field variations based on the inductive coupling of 2 coils. Therefore, wide application of digital isolators as an isolator to be used in fields such as the industrial and medical fields is expected and the development digital isolators is actively progressing.

A digital isolator having a transformer in which solenoid coils that include magnetic bodies of, for example, ferrite, are arranged in parallel on a semiconductor substrate has been proposed as one such digital isolator. See, for example Wang, N., et al, "Thin Film Microtransformer Integrated on Silicon for Signal Isolation" (USA), IEEE Transactions on Magnetics, Vol. 43, No. 6, June 2007, pp. 2719-2721 (also referred to herein as "Non-Patent Literature 1") and Xu, M., et al, "A Microfabricated Transformer for High-Frequency Power or Signal Conversion" (USA), IEEE Transactions on Magnetics, Vol. 34, No. 4, July 1998, pp. 1369-1371 (also referred to herein as "Non-Patent Literature 2"). Further, a digital isolator having a transformer in which 2 planar coils are layered via an insulating film on a semiconductor substrate, has been proposed as a digital isolator without magnetic bodies. See, for example, U.S. Pat. No. 7,683,654 (also referred to herein as "Patent Literature 1"), U.S. Pat. No. 6,927,662 (also referred to herein as "Patent Literature 2") and U.S. Pat. No. 7,417,301 (also referred to herein as "Patent Literature 2"). See also, for example, Chen, B., "Isolated Half-Bridge Gate Driver with Integrated High-Side Supply" (Greece), IEEE Power Electronics Specialists Conference (PESC) 2008, June 2008, pp. 3615-3618 (also referred to herein as "Non-Patent Literature 3"), Kaeriyama, S., "A 2.5 kV Isolation 35 kV/us CMR 250 Mbps 0.13 mA/Mbps Digital Isolator in Standard CMOS with an on-Chip Small Transformer" (USA), IEEE Symposium on VLSI Circuits (VLSIC) 2010, June 2010, pp. 197-198 (also referred to herein as "Non-Patent Literature 4"), Munzer, M., "Coreless Transformer a New Technology for Half Bridge Driver IC's" (Germany), International Exhibition and Conference for Power Electronics, Intelligent Motion and Power Quality (PCIM)), May 2003 (also referred to herein as "Non-Patent Literature 5"), Analog Devices, Inc., "Datasheet of ADuM1234 (Analog Devices Application Note)", 2007, pp. 1-10 (also referred to herein as "Non-Patent Literature 6") and Infineon Technologies AG, "Datasheet of 2DE020I12-FI (Infineon Technologies Application Note)", 2006 (also referred to herein as "Non-Patent Literature 7").

As another digital isolator without magnetic bodies, a digital isolator having a transformer that has 2 coils formed of a metal film and embedded in 2 spiral-shaped, planar trenches formed in the same principal surface of the semiconductor substrate, has been proposed. See, for example, U.S. patent application Ser. No. 13/215,350 (also referred to herein as "Patent Literature 4") and Rongxiang, W., "A Novel Silicon-Embedded Coreless Transformer for Isolated DC-DC Converter Application" (USA), IEEE 23rd International Symposium on Power Semiconductor Devices and ICs (ISPSD) 2011, May 2011, pp. 352-355 (also referred to herein as "Non-Patent Literature 8").

However, the isolators of Non-Patent Literature 1 and 2 have cylindrical-shaped coils (solenoid coils) of spirally wound metal wire and because the thickness of the metal wire forming the coil cannot be increased, problems of increased DC resistance of the coil and decreased voltage gain arise. Furthermore, since overcurrent arises and the coil generates heat, a problem of large loss arises. In the isolators of the Patent Literature 1-3 and Non-Patent Literature 3-7, the thickness of the metal film forming the coils (planar coils) cannot be increased. Consequently, problems arise in that the DC resistance of the coil is high and the voltage gain is small.

In the isolator of Patent Literature 4 and Non-Patent Literature 8, the insulating film for electrically insulating the coil embedded in each of the 2 trenches is formed along a side wall of the trench and thus, the insulating film cannot be formed to be thick. Therefore, a problem arises in that high voltage tolerance becomes difficult.

Further, in the isolator of Patent Literature 4 and Non-Patent Literature 8, because the 2 coils oppose one another at the side wall of the trench, the area of the opposing portions is greater than that of other isolators. As a result, large parasitic capacitance arises and the isolator is easily affected by noise.

Thus, there are certain shortcomings in the related art.

SUMMARY OF THE INVENTION

Embodiments of the invention address these and other shortcomings. To that end, embodiments of the invention provide an isolator and an isolator manufacturing method that enable size reductions. Some embodiments provide an isolator and isolator manufacturing method that enable improvement of electrical characteristics. Some embodiments provide an isolator and isolator manufacturing method that enable high voltage tolerance to be realized.

Further, some embodiments of the invention provide an isolator that includes one or more of the following. In some embodiments, a transmission circuit is disposed in a first principal surface of a first semiconductor substrate. In some embodiments, a transformer has a configuration where a primary coil electrically coupled to the transmission circuit and a secondary coil electrically coupled to a reception circuit opposed one another in an electrically isolated state, and transmits in an electrically isolated state and to the reception circuit, a signal of the transmission circuit. Further, the transformer can be disposed in a second principal surface side of an area that is of the first semiconductor substrate and in which the transmission circuit is disposed. The isolator according to some embodiments can have the following characteristics.

In some embodiments, a trench is disposed in the second principal surface of the first semiconductor substrate and along a side wall and bottom aspect of the trench, an oxide film is disposed. The primary coil is configured by a metal film embedded in an oxide film inside the trench and exposed at the second principal surface of the first semiconductor substrate. The primary coil is covered by an insulating film. The secondary coil is configured by a metal film that is disposed inside the insulating film, opposing the primary coil, and electrically isolated from the primary coil by the insulating film.

Some embodiments include via holes that reach the trench from the first principal surface of the first semiconductor substrate. The transmission circuit and the primary coil are electrically coupled by a metal film embedded in the via holes.

Some embodiments include bump electrodes disposed at the secondary coil. The first semiconductor substrate is mounted by the bump electrodes.

Some embodiments include a reception circuit that receives the signal from the transmission circuit. The reception circuit is disposed in a second semiconductor substrate that is different from the first semiconductor substrate.

Some embodiments include the following characteristics. A first transmission circuit and a first reception circuit are disposed in a first principal surface of a first semiconductor substrate. A second transmission circuit and a second reception circuit disposed in the first principal surface of the second semiconductor substrate. The first reception circuit receives a signal from the second transmission circuit. The second reception circuit receives a signal from the first transmission circuit. A first transformer has a configuration where a primary coil electrically coupled to the first transmission circuit and a secondary coil electrically coupled to the second reception circuit opposed one another in an electrically isolated state, and further shifts the electrical potential level of the signal from the first transmission circuit to the second reception circuit. The first transformer is disposed at a second principal surface side of an area that is of the first semiconductor substrate and in which the first transmission circuit is disposed. A second transformer has a configuration where a primary coil electrically coupled to the second transmission circuit and a secondary coil electrically coupled to the first reception circuit opposed one another in an electrically isolated state, and further shifts the electrical potential of a signal from the second transmission circuit to the first reception circuit. The second transformer is disposed at a second principal surface side of an area that is of the second semiconductor substrate and in which the second transmission circuit is disposed.

Some embodiments include forming a transmission circuit in a first principal surface of a semiconductor substrate; forming a trench in a second principal surface of the semiconductor substrate, at an area in which the transmission circuit is formed; forming an oxide film along a side wall and bottom aspect of the trench; embedding a first metal film in the oxide film inside the trench, so as to be exposed at the second principal surface of the semiconductor substrate; forming an insulating film on the second principal surface of the semiconductor substrate, so as to cover the first metal film; and forming in the insulating film, a second metal film that opposes the first metal film and that is electrically isolated from the first metal film by the insulating film.

Some embodiments include forming via holes that reach the trench from the first principal surface of the semiconductor substrate, the forming of the oxide film includes forming the oxide film along a side wall of the via holes, and the embedding of the first metal film includes embedding the first metal film in the oxide film inside the via holes.

Some embodiments include simultaneously embedding the first metal film inside the via holes and inside the trench, the embedding of the first metal film preferably includes forming the first metal film by electroplating processing, and the forming of the second metal film preferably includes forming the second metal film by electroplating processing.

In some embodiments, a transmission circuit can be disposed in a first principal surface of a semiconductor substrate and a transformer configured by a primary coil and a secondary coil can be disposed in an entire second principal surface of the semiconductor substrate. As a result, even if a transmission circuit and a transformer are disposed in a single semiconductor substrate, the semiconductor substrate can be reduced in size to a degree just fitting the outer most peripheries of the coils configuring the transformer.

In some embodiments, by disposing the transformer in the second principal surface of the semiconductor substrate, a signal from the transmission circuit disposed in the first principal surface of the semiconductor substrate can be extracted from the second principal surface side of the semiconductor substrate. Consequently, the coil-induced magnetic effects on the transmission circuit disposed in the first principal surface of the semiconductor substrate can be reduced. Further, the integration of the transmission circuit and the reception circuit in different semiconductor substrates enables the occurrence of transmission circuit malfunctions consequent to dV/dt occurring at the reception circuit side to be suppressed. Moreover, since the transformer does not require magnetic bodies among the components, the transformer is not limited to the characteristics of operating frequency by the hysteresis of magnetic bodies.

In some embodiments, the primary coil is configured by a metal film embedding the trench, thereby enabling the cross-sectional area of the primary coil to be increased according to the depth of the coil trench. Consequently, the DC resistance of the primary coil can be decreased and a large voltage gain can be obtained. Further the primary coil is formed within the trench and the secondary coil is formed within the insulating film and consequently, the coils do not oppose one another at trench side walls, like a conventional transformer having coils formed in 2 trenches, respectively. Therefore, compared to a conventional transformer, the area of the portion where the primary coil and the secondary coil opposed one another can be reduced. Accordingly, parasitic capacitance between the primary coil and the secondary coil can be reduced, thereby enabling the delay of signal transmission from the transmission circuit to the reception circuit to be reduced. Accordingly, the electrical characteristics of the isolator can be improved. Further, the thickness of the insulating film at the portion sandwiched by the primary coil and the secondary coil can be easily increased, thereby enabling high voltage tolerance to be facilitated.

Thus, some embodiments of the present invention enable size reductions, improvement of electrical characteristics, and the realization of high voltage tolerance.

DETAILED DESCRIPTION

Figure 1:
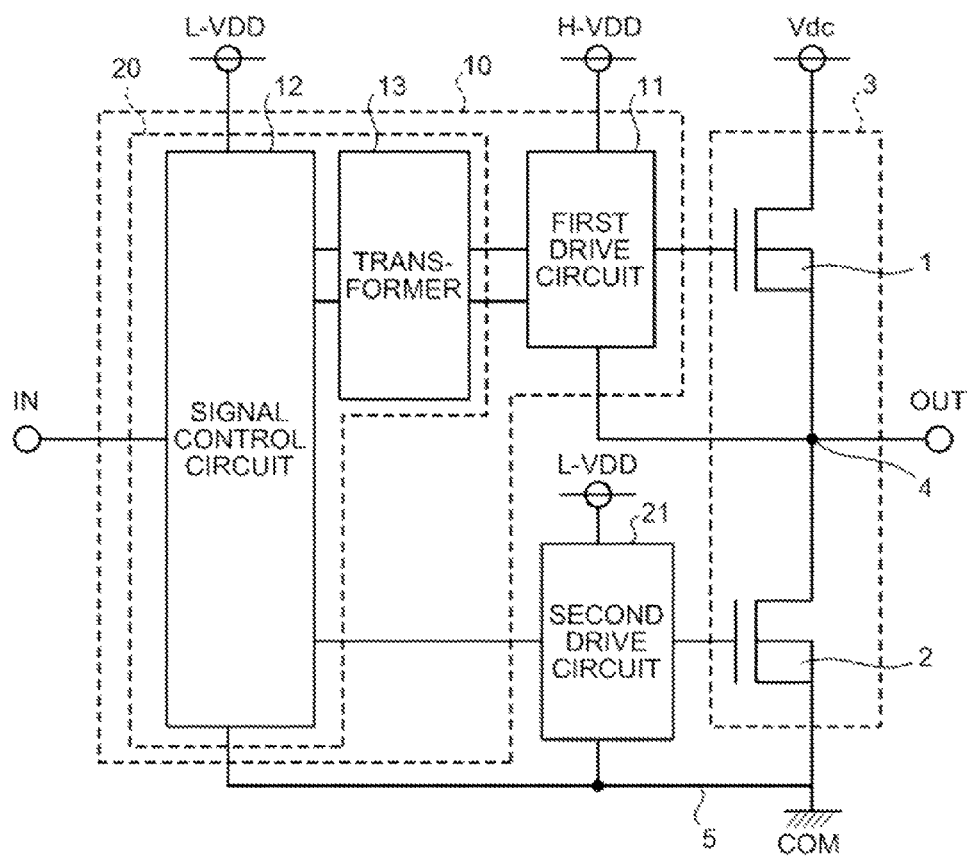
FIG. 1 is a block diagram depicting an example of an overall configuration of a semiconductor device to which an isolator according to a first embodiment is applied.

With reference to the accompanying drawings, embodiments of an isolator and an isolator manufacturing method according to some embodiments of the present invention will be described in detail. In the present specification and accompanying drawings, layers and/or areas indicated with "n" or "p", indicates that electrons or holes are the majority carriers, respectively. "+" or "−" appended to "n" or "p" indicates a relatively higher or a relatively lower impurity concentration as compared to the impurity concentration of a layer or area without "+" or "−" appended thereto. In the description of the embodiments and in the accompanying drawings hereinafter, identical components are given the same reference numerals and redundant description is omitted.

First Embodiment

FIG. 1 is a block diagram depicting an example of an overall configuration of a semiconductor device to which an isolator according to a first embodiment is applied. An example of an overall configuration of a semiconductor device to which the isolator according to the present invention is applied will be described. The semiconductor device depicted in FIG. 1 is configured by a bridge circuit 3 configured by a first metal-oxide-semiconductor field effect transistor (MOSFET) 1 and a second MOSFET 2; an isolator 10 that includes a first drive circuit 11 that drives the first MOSFET 1 of the upper arm; and a second drive circuit 21 that drives the second MOSFET 2 of the lower arm.

The bridge circuit 3 is an external-output circuit that via a connection point 4 of the source of the first MOSFET 1 and the drain of the second MOSFET 2, outputs a signal from an output terminal OUT to an external destination. The drain of the first MOSFET 1 of the upper arm is connected to source voltage Vdc. The source of the first MOSFET 1 is connected to the drain of the second MOSFET 2 of the lower arm. The gate of the first MOSFET 1 is connected to the first drive circuit 11 disposed upstream from the first MOSFET 1. The first MOSFET 1 is driven by a gate signal input thereto from the first drive circuit 11.

The source of the second MOSFET 2 is connected to reference potential COM that is lower than the electrical potential of the connection point 4 of the source of the first MOSFET 1 and the drain of the second MOSFET 2. The reference potential COM is, for example, ground potential. The gate of the second MOSFET 2 is connected to the second drive circuit 21 disposed upstream from the second MOSFET 2. The second MOSFET 2 is driven by a gate signal input thereto from the second drive circuit 21.

The isolator 10 is configured by the first drive circuit 11, a signal control circuit 12, and a transformer 13. The signal control circuit 12 is disposed upstream from the first drive circuit 11 and the second drive circuit 21; and based on a signal input from an input terminal IN, outputs a signal to the first drive circuit 11 and the second drive circuit 21. The transformer 13 is disposed between the signal control circuit 12 and the first drive circuit 11; and implements an isolation function of transmitting in an electrically isolated state and to the first drive circuit 11, a signal input from the signal control circuit 12. Specifically, the transformer 13 is configured by a primary coil (not depicted) and a secondary coil (not depicted) and uses magnetic field variations based on inductive coupling with a signal transmitting unit, to transmit in an electrically isolated state and to the first drive circuit 11, a signal from the signal control circuit 12 (i.e., perform isolated transmission).

More specifically, the signal control circuit 12 is connected to the reference potential COM, via a reference voltage line 5. The signal control circuit 12 is connected to source voltage L-VDD, which uses the reference potential COM as a reference. The first drive circuit 11 is connected to source voltage H-VDD that uses the connection point 4 of the source of the first MOSFET 1 and the drain of the second MOSFET 2 as a reference potential. Consequently, the transformer 13 implements a level shifting (upward shifting) function of shifting the electrical potential level of the signal that is from the signal control circuit 12 to the first drive circuit 11. Meanwhile, the second drive circuit 21 is connected to the reference potential COM via the reference voltage line 5, and is of the same reference potential COM as the signal control circuit 12. Consequently, a level shifting function between the signal control circuit 12 and the second drive circuit 21 is not necessary.

Among the components of the isolator 10, the signal control circuit 12 and the transformer 13 are integrated on a semiconductor substrate 20. On the other hand, among the components of the isolator 10, the first drive circuit 11 of the upper arm is integrated on a semiconductor substrate that is different from the semiconductor substrate 20 on which the signal control circuit 12 and the transformer 13 are integrated. This is because the signal control circuit 12 and the transformer 13 having the cross-sectional configuration described hereinafter can be formed in the semiconductor substrate 20 easily by general IC processing. The first MOSFET 1 and the second MOSFET 2, for example, may be formed in the same semiconductor substrate as the first drive circuit 11 or may be formed in yet another different semiconductor substrate. The second drive circuit 21 of the lower arm may be formed in the semiconductor substrate 20 together with the signal control circuit 12 and the transformer 13.

Figure 2:
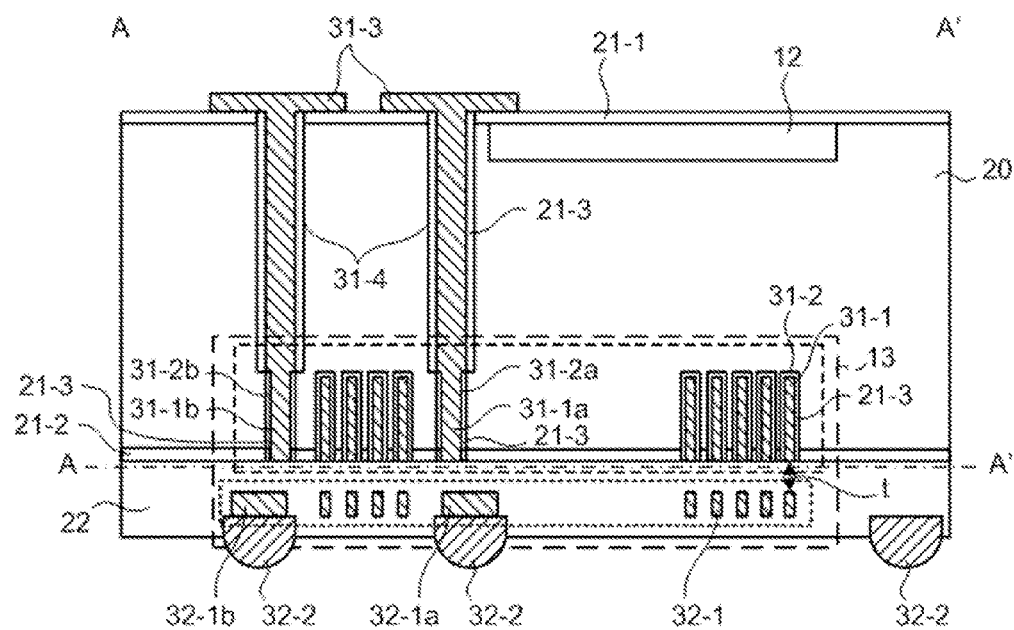
FIG. 2 is schematic cross sectional view of a portion of the components of the isolator according to the first embodiment.
Figure 3:
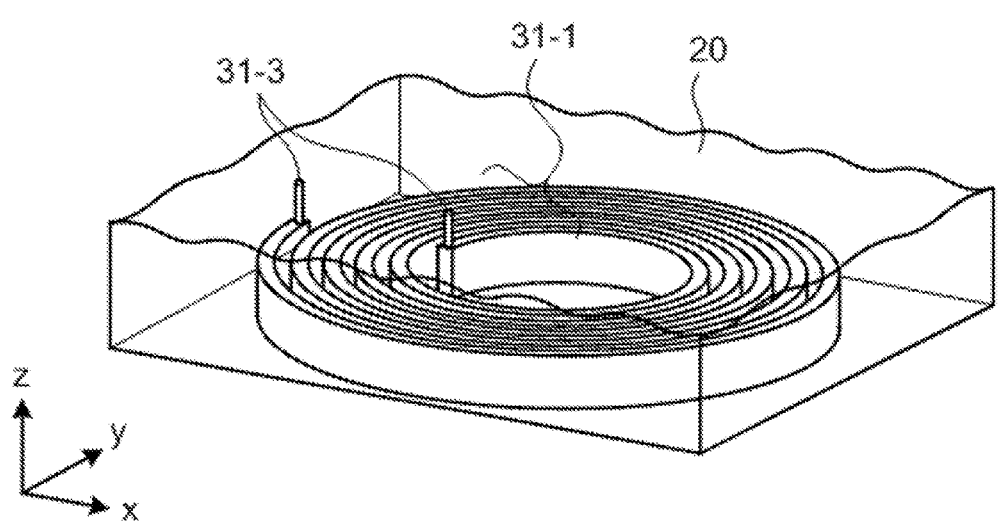
FIG. 3 is a schematic perspective view of the configuration of a transformer along line A-A depicted in FIG. 2.
Figure 4:
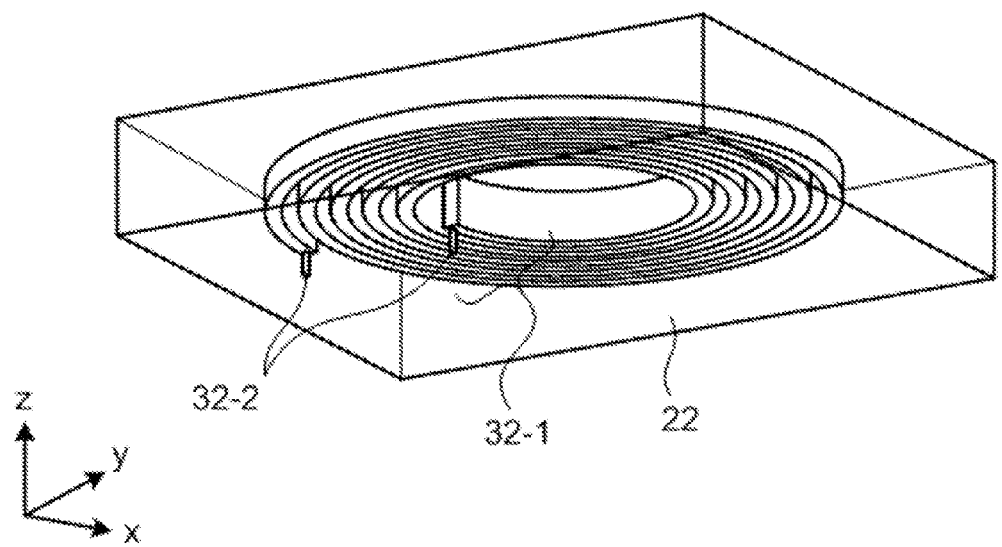
FIG. 4 is a schematic perspective view of the configuration of the transformer along line A-A depicted in FIG. 2.
Figure 5:
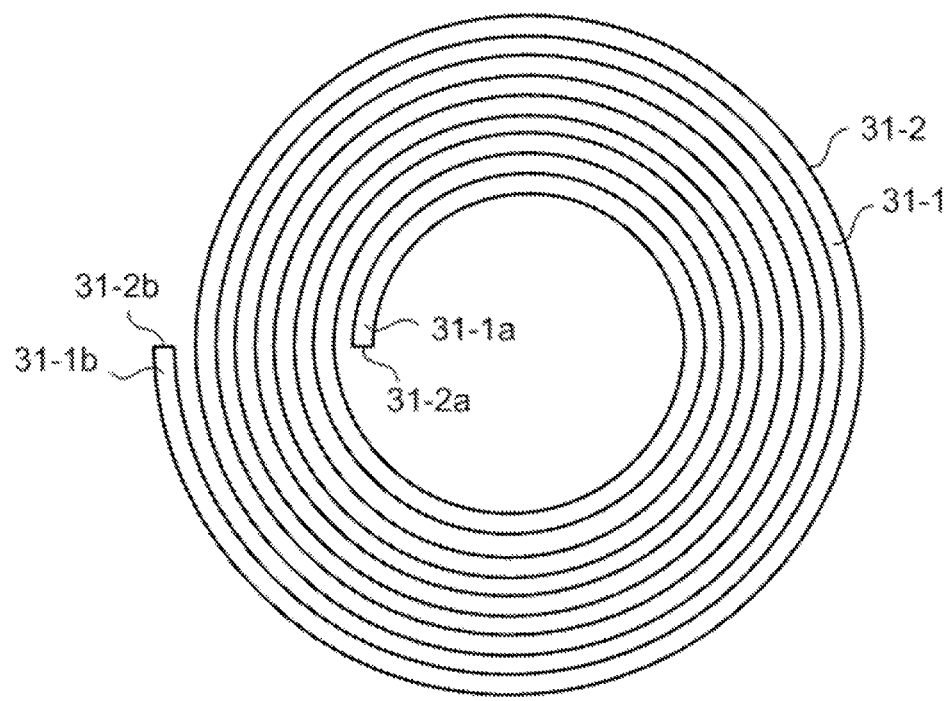
FIG. 5 is schematic plan view of the planar shape of the transformer according to the first embodiment.

The cross-sectional configuration of the semiconductor substrate 20 in which the signal control circuit 12 and the transformer 13 are integrated will be described. FIG. 2 is schematic cross sectional view of a portion of the components of the isolator according to the first embodiment. FIGS. 3 and 4 are schematic perspective views of the configuration of the transformer along a line A-A depicted in FIG. 2. FIG. 5 is schematic plan view of the planar shape of the transformer according to the first embodiment. FIG. 3 depicts the configuration on the semiconductor substrate 20 side of the line A-A' depicted in FIG. 2. In other words, in FIG. 3, the configuration on a primary coil 31-1 side (portion encompassed by broken line finer than that of the transformer 13) of the transformer 13 (portion encompassed by coarsest broken line) is depicted. In FIG. 3, depiction of the configuration on an anterior surface (first principal surface) side of the semiconductor substrate 20 is omitted. FIG. 4 depicts the configuration on an insulating film 22 side of the line A-A' depicted in FIG. 2. In other words, in FIG. 4, the configuration on a secondary coil 32-1 side of the transformer 13 is depicted (portion encompassed by finest broken line). Further, in FIGS. 3 and 4, directions parallel to the x and y axes are directions parallel to the principal surface of the semiconductor substrate 20 and the direction of the z axis is the direction toward the anterior surface from a posterior surface (second principal surface) of the semiconductor substrate 20.

As depicted in FIG. 2, the signal control circuit 12 is disposed on, for example, the anterior surface of the semiconductor substrate 20, which is formed of silicon and is of a p-type. The signal control circuit 12 has a general device architecture, for example, an n-channel MOSFET (not-depicted, similarly hereinafter, depiction of device architecture of transmission circuit omitted in FIGS. 6 to 12). The basic circuit unit of the signal control circuit 12 is configured, for example, by a transmission circuit (not depicted) for transmitting a signal to a reception circuit (not depicted). Hereinafter, the signal control circuit 12 is described as a transmission circuit. The reception circuit is a circuit to which a signal from the signal control circuit 12 is input and corresponds to the first drive circuit 11. Hereinafter, the first drive circuit 11 is regarded as a reception circuit.

The principal surface of the semiconductor substrate 20 is preferably, for example, [100] face. The reason being that when the channel mobility of, for example, the MOSFET formed in the semiconductor substrate 20 is at the maximum, this is the plane orientation at which the electrical characteristics of a transmission circuit 12 are best. The specific resistance of the semiconductor substrate 20 can be varied according to design conditions of the device forming the transmission circuit 12. The thickness of the semiconductor substrate 20 can be varied by the depth of a coil trench 31-2 for the primary coil 31-1 of the transformer 13 described hereinafter.

Meanwhile, as depicted in FIGS. 2 to 4, the transformer 13 is disposed on the posterior surface side of the area in which the transmission circuit 12 of the semiconductor substrate 20 is disposed. The transformer 13 is configured by the primary coil 31-1 and the secondary coil 32-1, respectively of a given number of turns. The primary coil 31-1 is disposed in the semiconductor substrate 20, on the posterior surface side of the semiconductor substrate 2. The primary coil 31-1 is drawn to the anterior surface of the semiconductor substrate 20 by terminals 31-3 and is electrically coupled to the transmission circuit 12. The secondary coil 32-1 is disposed in the insulating film 22 on the posterior surface of the semiconductor substrate 20 and opposes the primary coil 31-1 via the insulating film 22. Bump electrodes 32-2 that are exposed to the exterior of the insulating film 22 are formed at the secondary coil 32-1. The bump electrodes 32-2 are electrically coupled to terminals of the reception circuit. The insulating film 22 may be, for example, a benzocylcobutene (BCB) film.

Specifically, the transformer 13 has the following configuration. On the anterior surface and the posterior surface of the semiconductor substrate 20, oxide films 21-1 and 21-2 are formed, respectively. The oxide films 21-1 and 21-2 may be a low temperature oxide (LTO) film. Two trenches 31-4 are disposed in the anterior surface of the semiconductor substrate 20. The trenches 31-4 (hereinafter, via trenches) are via holes drawing the primary coil 31-1 on the posterior surface side of the semiconductor substrate 20 to the anterior surface side of the semiconductor substrate 20. The via trenches 31-4 pass through the oxide film 21-1 of the anterior surface of the semiconductor substrate 20 and are disposed to a given depth from the anterior surface of the semiconductor substrate 20.

Meanwhile, in the posterior surface of the semiconductor substrate 20, the coil trench 31-2 for disposing the primary coil 31-1 is disposed. In the posterior surface of the semiconductor substrate 20 and opposing the area in which the transmission circuit 12, the coil trench 31-2 is disposed, for example, in a planar-spiral of a given number of turns (FIG. 5). Further, the coil trench 31-2 passes through the oxide film 21-2 of the posterior surface of the semiconductor substrate 20 and is disposed to a depth reaching the via trenches 31-4. Terminal portions 31-2a and 31-2b of the coil trenches 31-2 are coupled to different via trenches 31-4, respectively.

An oxide film 21-3 is disposed along a side wall and bottom surface of the coil trench 31-2, and along a side wall of the via trenches 31-4. The terminal portions 31-2a and 31-2b of the coil trench 31-2 are coupled to the via trenches 31-4 and consequently, at the terminal portions 31-2a and 31-2b, the oxide film 21-3 is disposed only on the side wall. Inside the coil trench 31-2 and the via trenches 31-4, a metal film of primarily, for example, copper (Cu), gold (Au), or aluminum (Al), is embedded in the oxide film 21-3, to be exposed at the surfaces (posterior surface and anterior surface) of the semiconductor substrate 20.

The planar-spiral shaped metal film embedded inside the coil trench 31-2 is the primary coil 31-1. Insulation tolerance between the adjacent spiral wires of the primary coil 31-1 is established by the oxide film 21-3 disposed on the side wall of the coil trench 31-2. Further, the deeper the shape of the coil trench 31-2, the more the cross-sectional area of the metal film embedded in the coil trench 31-2 increases and therefore, the resistance consequent to the wound wire of the primary coil 31-1 can be decreased. The metal film embedded in the via trenches 31-4 forms the terminals 31-3 of the primary coil 31-1. The terminals 31-3 of the primary coil 31-1 are electrically isolated from one another by the oxide film 21-3 formed on the side wall of the via trenches 31-4.

The terminals 31-3 of the primary coil 31-1 are respectively connected to terminal portions 31-1a and 31-1b of the primary coil 31-1 in the via trenches 31-4. The terminals 31-3 of the primary coil 31-1 are disposed from inside the via trenches 31-4, to be exposed above the oxide film 21-1 on the anterior surface of the semiconductor substrate 20. In other words, the terminal portion 31-1a at a central portion side of the primary coil 31-1 and the terminal portion 31-1b at an outer most periphery of the primary coil 31-1 are drawn to the anterior surface of the semiconductor substrate 20 by respectively different terminals 31-3.

The insulating film 22 is disposed on the posterior surface of the semiconductor substrate 20 so as to cover the primary coil 31-1. Inside the insulating film 22, the secondary coil 32-1 is disposed opposing the primary coil 31-1. The secondary coil 32-1 is 1 continuous spiral-shaped planar coil. Further, the secondary coil 32-1 is electrically isolated from the primary coil 31-1 by the insulating film 22. The thickness t of the insulating film 22 at a portion sandwiched by the primary coil 31-1 and the secondary coil 32-1 can be varied according to the desired voltage tolerance class. The secondary coil 32-1 can be a metal of primarily, for example, copper (Cu), gold (Au), or aluminum (Al).

At for example, the terminal portion of the secondary coil 32-1, pads 32-1a and 32-1b are disposed. At the pads 32-1a and 32-1b of the secondary coil 32-1, the bump electrodes 32-2 are disposed, respectively. The bump electrodes 32-2 are exposed to the exterior of the insulating film 22. Further, a bump electrode 32-2 that is not connected to the secondary coil 32-1 is disposed at an outer periphery terminal portion of the semiconductor substrate 20, whereby the height of the semiconductor substrate 20 when mounted to an insulating substrate (not depicted) may be made even. Thus, by disposing the bump electrode 32-2 that is not connected to the secondary coil 32-1, wobble of the semiconductor substrate 20 mounted on the insulating substrate (not depicted) can be prevented. Nonetheless, the bump electrode 32-2 that is not connected to the secondary coil 32-1 is not involved in the operation of the transformer 13 and therefore, may be omitted.

Figure 6:
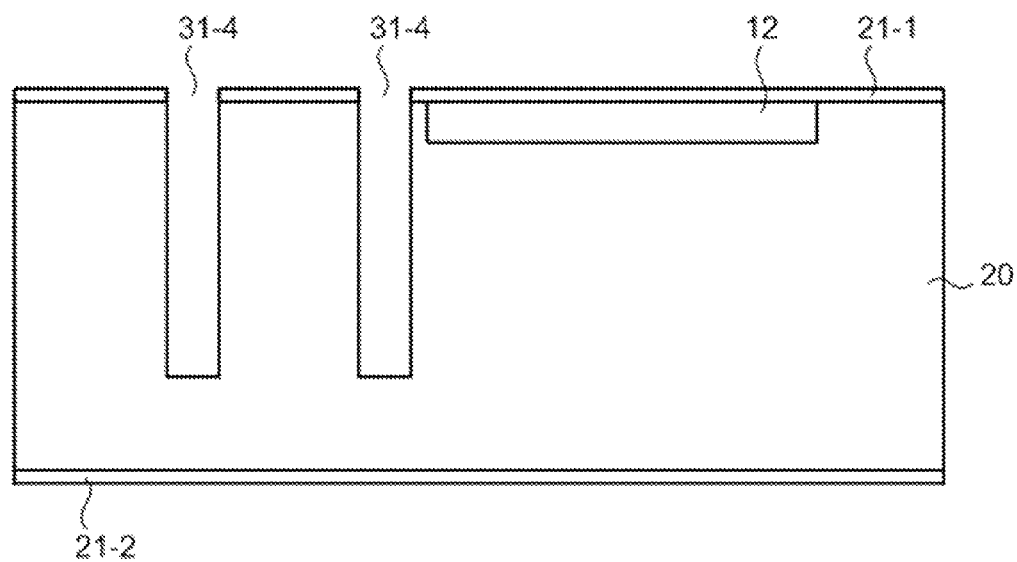
FIG. 6 is a cross sectional view of the isolator (under manufacture) according to the first embodiment.

A manufacturing method of the transformer 13 will be described. FIGS. 6 to 12 are cross sectional views of the isolator (under manufacture) according to the first embodiment. As depicted in FIG. 6, the semiconductor substrate 20 of a p-type and formed of silicon is prepared. At the anterior surface of the semiconductor substrate 20, the transmission circuit 12 is formed by general IC processing. The posterior surface of the semiconductor substrate 20 is polished and the thickness of the semiconductor substrate 20 is reduced to, for example, between 200 and 300 micrometers. The thickness of the semiconductor substrate 20 may be reduced before the transmission circuit 12 is formed at the anterior surface of the semiconductor substrate 20.

On the anterior surface and the posterior surface of the semiconductor substrate 20, the oxide films 21-1 and 21-2 are deposited, respectively, to a thickness of, for example, 3 micrometers. By photolithography, the oxide film 21-1 formed on the anterior surface of the semiconductor substrate 20 is patterned. The patterned the oxide film 21-1 is used as a mask to selectively remove the semiconductor substrate 20 and form the 2 via trenches 31-4. The depth and width of the via trenches 31-4 may be, for example, between 150 and 250 micrometers and between 25 and 35 micrometers, respectively.

Figure 7:
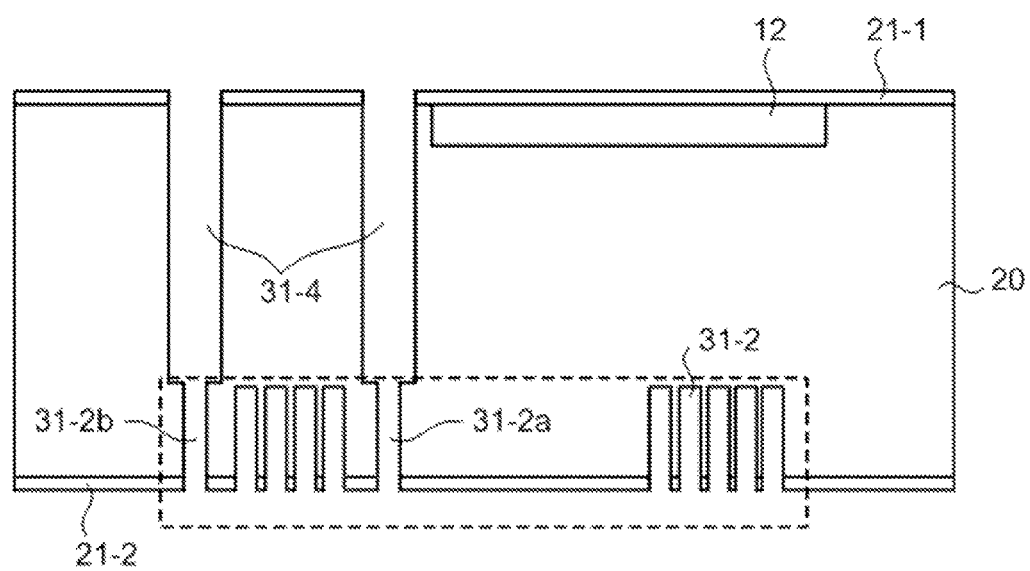
FIG. 7 is a cross sectional view of the isolator (under manufacture) according to the first embodiment.

As depicted in FIG. 7, by photolithography, the oxide film 21-2 formed on the posterior surface of the semiconductor substrate 20 is patterned and an opening having a planar-spiral shape of a given number turns is formed in the oxide film 21-2. The opening of the oxide film 21-2 is formed at a position corresponding to the posterior surface side of the area in which the transmission circuit 12 of the semiconductor substrate 20 is formed. The patterned oxide film 21-2 is used as a mask to selectively remove the semiconductor substrate 20 and form the coil trench 31-2 at the depth reached by the via trenches 31-4. Consequently, the coil trench 31-2 is formed in a planar-spiral and the terminal portions 31-2a and 31-2b of the coil trench 31-2 are coupled to respectively different via trenches 31-4.

By forming the via trenches 31-4 and the coil trench 31-2 in this manner, the via trenches 31-4 pass through the semiconductor substrate 20 from the anterior surface to posterior surface at the terminal portions 31-2a and 31-2b of the coil trench 31-2. The depth and width of the coil trench 31-2 are, for example, 50 micrometers and 10 micrometers, respectively, and the interval of the adjacent coil trenches 31-2 may be, for example, 5 micrometers. The via trenches 31-4 may be formed after the coil trench 31-2 is formed.

Figure 8:
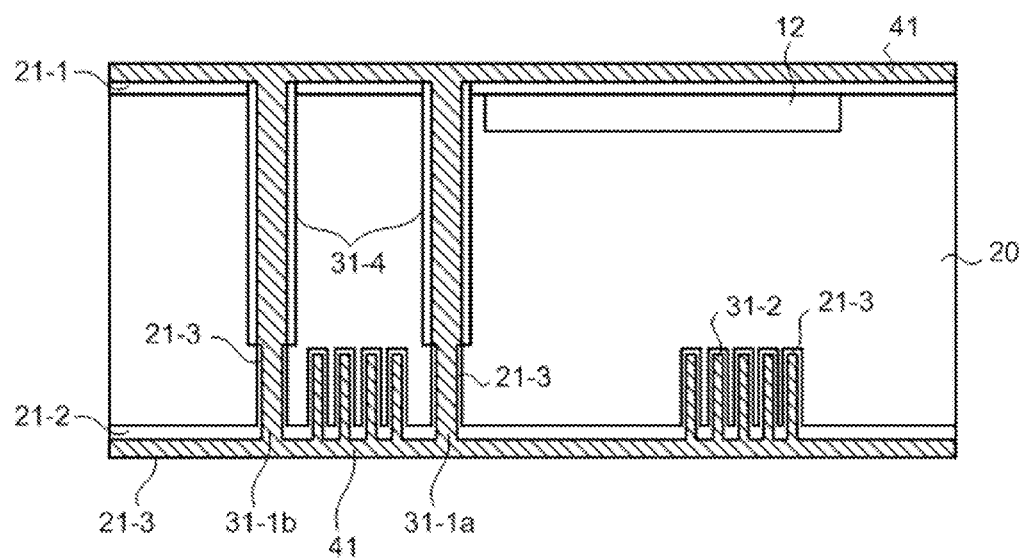
FIG. 8 is a cross sectional view of the isolator (under manufacture) according to the first embodiment.

As depicted in FIG. 8, oxide film such as an LTO film is newly deposited on the anterior surface and the posterior surface of the semiconductor substrate 20, the side wall and bottom aspect of the coil trench 31-2, and the side wall of the via trenches 31-4. Consequently, the thickness of the oxide films 21-1 and 21-2 on the anterior surface and the posterior surface of the semiconductor substrate 20 becomes thicker and the oxide film 21-3 is formed along the side wall and bottom aspect of the coil trench 31-2 and along the side wall of the via trenches 31-4.

On the oxide films 21-1 to 21-3 of the anterior surface and the posterior surface of the semiconductor substrate 20, the side wall and bottom aspect of the coil trench 31-2, and the side wall of the via trenches 31-4, first metal films, which are a barrier metal, are formed to a thickness of, for example, between 100 nm and 500 nm by a sputtering method. On each of the first metal films of the side wall and bottom aspect of the coil trench 31-2 and the side wall of the via trenches 31-4, a second metal film is deposited by a sputtering method to a thickness of, for example, between 1 and 3 micrometers.

Electrolytic plating is performed and the thickness of the second metal films formed on the anterior surface and the posterior surface of the semiconductor substrate 20, the side wall and bottom aspect of the coil trench 31-2, and the side wall of the via trenches 31-4 is increased. The second metal films deposited by a sputtering method before the electrolytic plating are a seed layer in the electrolytic plating process. Thus, in the anterior surface and the posterior surface of the semiconductor substrate 20 and the inside of the coil trench 31-2 and the via trenches 31-4, metal laminate films 41 of a 2-layer structure configured by the first and the second metal films is formed.

The first metal films may be formed by a metal of primarily, for example, titanium tungsten alloy (Ti/W). The second metal films are preferably formed of a metal primarily of copper. The reason being that since the second metal film can be formed by electrolytic plating, the time required for forming the second metal film can be reduced. Other than copper, the second metal films may be formed of the fabrication material of, for example, the first coil 31-1. In this case, the second metal films are formed only by a sputtering method, without the electrolytic plating.

Figure 9:
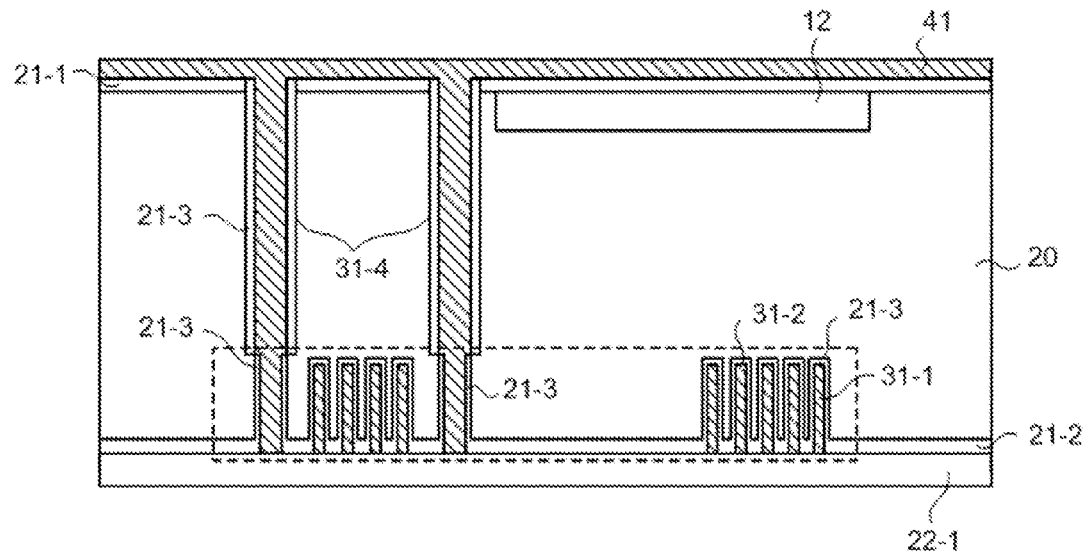
FIG. 9 is a cross sectional view of the isolator (under manufacture) according to the first embodiment.

As depicted in FIG. 9, by a chemical mechanical polishing method (CMP), the metal laminate film 41 on the posterior surface of the semiconductor substrate 20 is completely removed, exposing the oxide film 21-2, whereby inside the coil trench 31-2, the primary coil 31-1 (portion encompassed by broken line in FIG. 9), which is formed by the metal laminate film 41, is formed. Further, by a CMP method, the metal laminate film 41 on the anterior surface of the semiconductor substrate 20 is removed to a desired thickness. Next, for example, by a spin coating method, a first insulating film 22-1 such as a BCB film is deposited at a thickness of, for example, 10 micrometers on the posterior surface of the semiconductor substrate 20.

The thickness of the first insulating film 22-1 is the thickness t of the completed insulating film 22 (of the isolator 10 depicted in FIG. 2) at the portion sandwiched between the primary coil 31-1 and the secondary coil 32-1. Consequently, voltage tolerance is determined by the thickness of the first insulating film 22-1. By depositing the first insulating film 22-1 at a thickness of 10 micrometers, a voltage tolerance of 3500 V is established. Further, the first insulating film 22-1 further functions as a barrier film preventing diffusion of the metal laminate film 41 (the primary coil 31-1) embedded in the coil trench 31-2.

Figure 10:
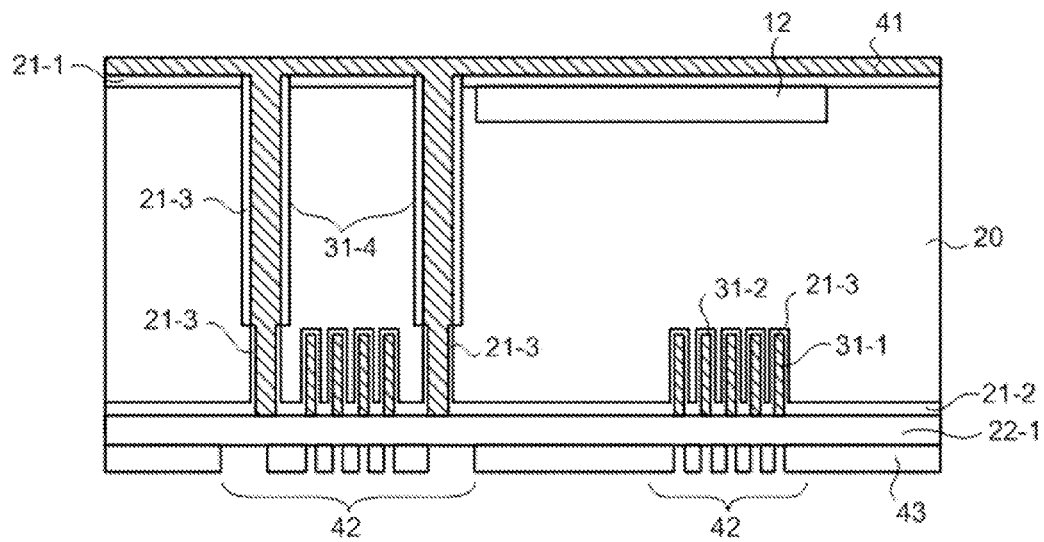
FIG. 10 is a cross sectional view of the isolator (under manufacture) according to the first embodiment.

As depicted in FIG. 10, a photoresist is applied on the first insulating film 22-1. The photoresist applied on the first insulating film 22-1 is selectively removed by photolithography and a resist mask 43 having an opening 42 of a planar-spiral shape is formed. The thickness of the resist mask 43 is assumed to be approximately the same thickness, e.g. 5 micrometers, as that of the secondary coil 32-1. The width of the opening 42 is, for example, between 4 and 10 micrometers and the interval between adjacent openings 42 may be, for example, between 4 and 10 micrometers.

On the side wall and bottom aspect of the opening 42, a third metal film forming a barrier metal is formed having a thickness of, for example, between 100 nm and 500 nm by a sputtering method. On the third metal film formed on the side wall and bottom aspect of the opening 42, a fourth metal film having a thickness of, for example, between 500 nm and 1 micrometer is further deposited by a sputtering method. The third metal film, for example, may be formed of a metal primarily of titanium tungsten alloy (Ti/W). The fourth metal film is preferably formed of a metal of primarily copper. The reason being identical to that in the case of forming the second metal film described above. When the fourth metal film is deposited using a material besides copper among the fabrication materials of the secondary coil 32-1, the fourth metal film is deposited by only a sputtering method, without the electrolytic plating described hereinafter.

Electrolytic plating is performed and the thickness of the fourth metal film formed on the side wall and bottom aspect of the opening 42 is increased. At this time, the fourth metal film is embedded inside the opening 42 until the thickness of the fourth metal film is of approximately the same thickness as the resist mask 43. The third metal film deposited by the sputtering method before the electrolytic plating is a seed layer in the electrolytic plating process. In the electrolytic plating process, the deposited fourth metal film is further deposited on the resist mask 43 and on the metal laminate film 41 of the anterior surface of the semiconductor substrate, not just in the opening 42.

Figure 11:
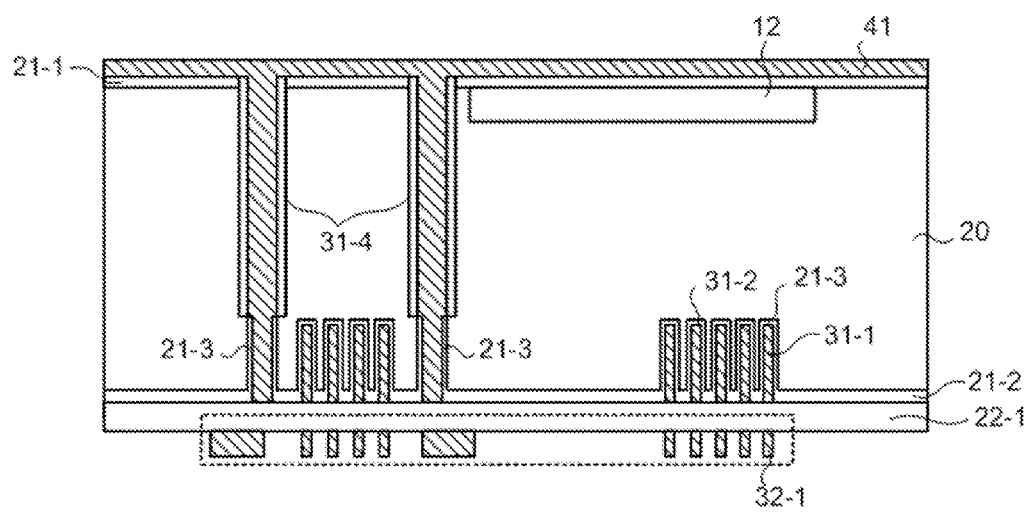
FIG. 11 is a cross sectional view of the isolator (under manufacture) according to the first embodiment.

The fourth metal film deposited on the resist mask 43 is removed by an LIGA process and consequently, the fourth metal film remains only inside the opening 42 of the resist mask 43. By removing the resist mask 43, as depicted in FIG. 11, the planar-spiral shaped fourth metal film remaining inside the opening 42 becomes the secondary coil 32-1 (portion encompassed by broken line in FIG. 11). The LIGA process is a microfabrication process by photolithograph (lithographie) using X-rays, electrolytic plating (galvanoformung), and molding (abformung).

Figure 12:
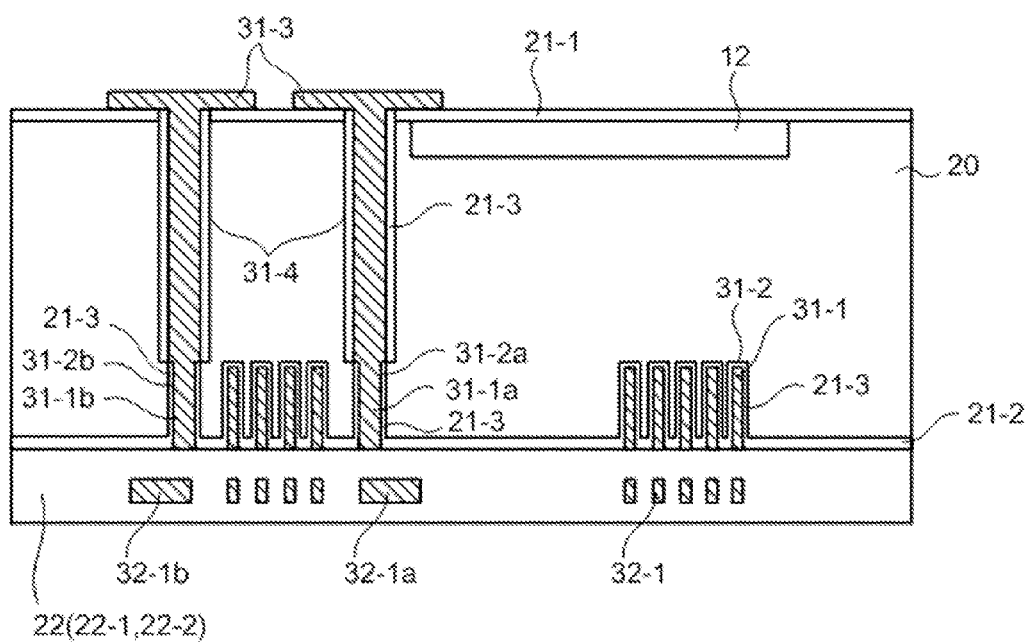
FIG. 12 is a cross sectional view of the isolator (under manufacture) according to the first embodiment.

As depicted in FIG. 12, a second insulating film 22-2 such as a BCB film is deposited on the first insulating film 22-1 of the posterior surface of the semiconductor substrate 20. The second insulating film 22-2 is formed to be embedded between the spirally wound wire of the secondary coil 32-1 and to cover the entire secondary coil 32-1. The second insulating film 22-2 functions as a protective film of the secondary coil 32-1. Consequently, the insulating film 22 formed by the first and the second insulating films 22-1, 22-2 is formed on the posterior surface of the semiconductor substrate 20. Further, the secondary coil 32-1, which is electrically isolated from the primary coil 31-1 by the first insulating film 22-1, is formed inside the insulating film 22. The insulating film 22 (first and second insulating films 22-1, 22-2) may be an oxide film formed by a plasma-enhanced chemical vapor deposition method (PECVD), a nitride film, a polyimide film, etc.

The metal laminate film 41 on the anterior surface of the semiconductor substrate 20 is selectively removed by photolithography, whereby the terminals 31-3 of the primary coil 31-1 are formed by the metal laminate film 41 remaining inside the via trenches 31-4 to the anterior surface of the semiconductor substrate 20. The insulating film 22 is selectively removed by photolithography, exposing the terminal portions of the secondary coil 32-1 and forming the pads 32-1a and 32-1b at the terminal portions of the secondary coil 32-1. The bump electrodes 32-2 are formed at the pads 32-1a and 32-1b of the secondary coil 32-1, thereby completing the transformer 13 depicted in FIG. 2.

Simulation results concerning electrical characteristics of the transformer 13 depicted in FIG. 2 and manufactured by the manufacturing method above will be given. Conditions of the transformer 13 used in the simulation are as follows. The voltage tolerance is assumed as 3500 V and the thickness t of the insulating film 22 at the portion sandwiched between the primary coil 31-1 and the secondary coil 32-1 is assumed as 10 micrometers. The radiuses of the primary coil 31-1 and the secondary coil 32-1 to the outer most edge is assumed as 350 micrometers and the radiuses of the primary coil 31-1 and the secondary coil 32-1 to the inner most edge is assumed as 120 micrometers. The number of turns of the primary coil 31-1 is assumed as 15 and the number of turns of the secondary coil 32-1 is assumed as 23. The dimensions of the transformer 13 in the simulation where the basic circuit unit of the signal control circuit 12 is assumed to be the transmission circuit, are set based on the surface area of the area of the semiconductor substrate 20, where the signal control circuit 12 is formed.

Simulation results confirm the transformer 13 of the present invention to have the following electrical characteristics. The mutual inductance of the transformer 13 was 107 nH; the resistance of the primary coil 31-1 was 0.8 ohm; and the coupling capacitance of the insulating film 22 at the area sandwiched by the primary coil 31-1 and the secondary coil 32-1 was 0.9 pF, thereby confirming that without substantially changing the size of the semiconductor substrate 20 necessary for forming the signal control circuit 12, the transformer 13 can be formed in the semiconductor substrate 20 and electrical characteristics of the above values can be obtained.

Figure 13:
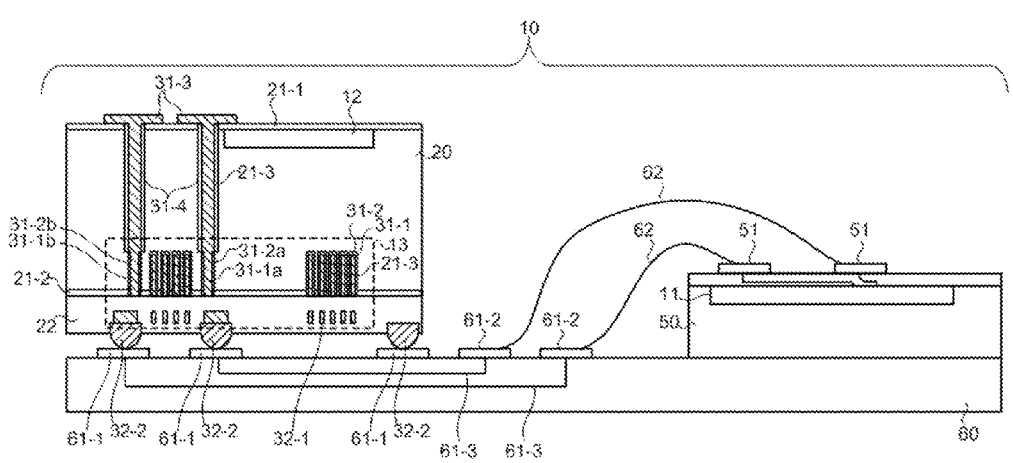
FIG. 13 is a schematic cross sectional view of the isolator according to the first embodiment.
Figure 14:
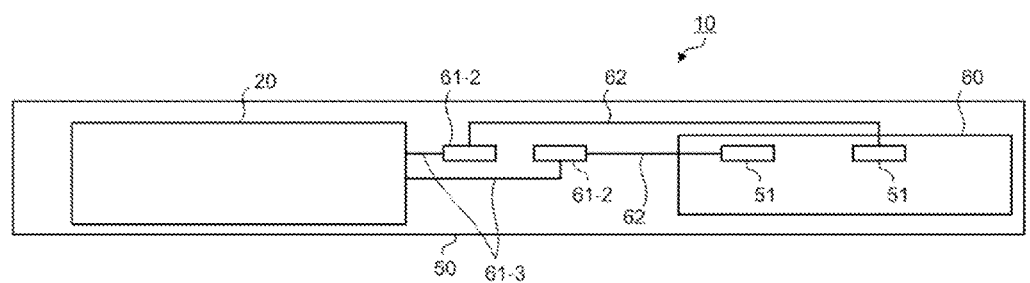
FIG. 14 is a schematic plan view of the isolator depicted in FIG. 13.
Figure 15:
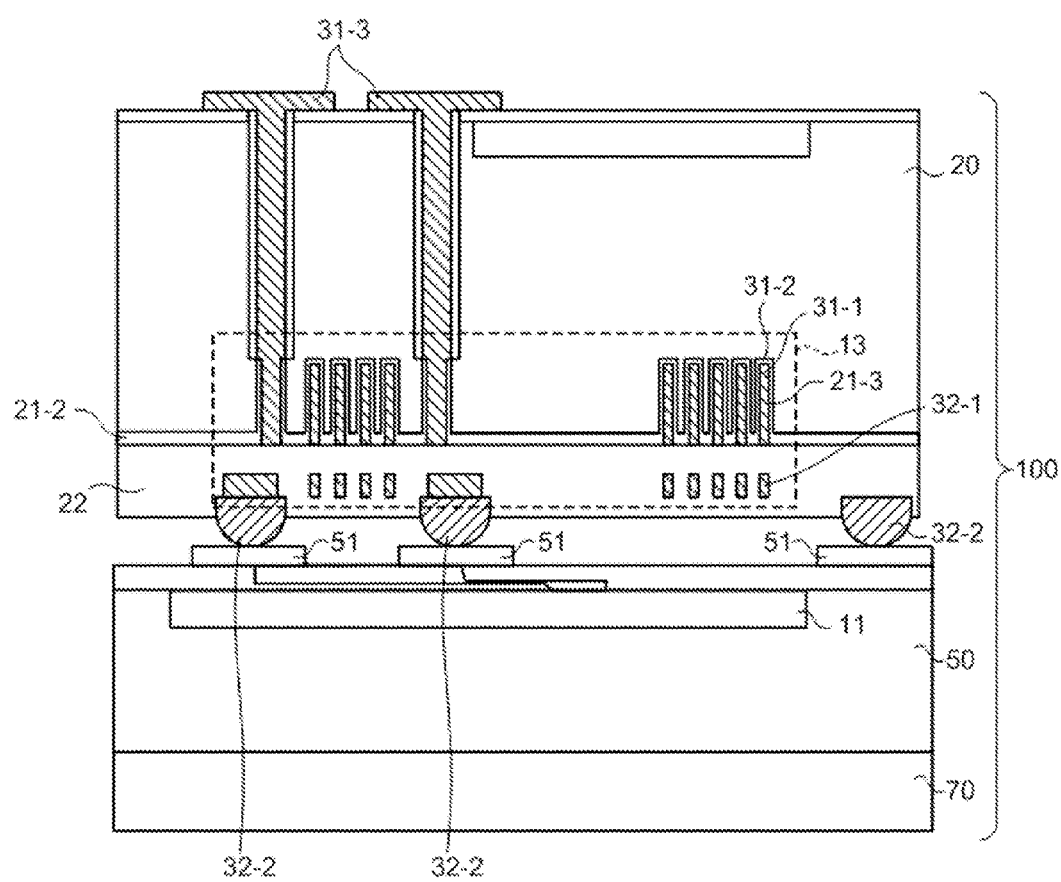
FIG. 15 is a schematic cross sectional view of the isolator according to a second embodiment.
Figure 17:
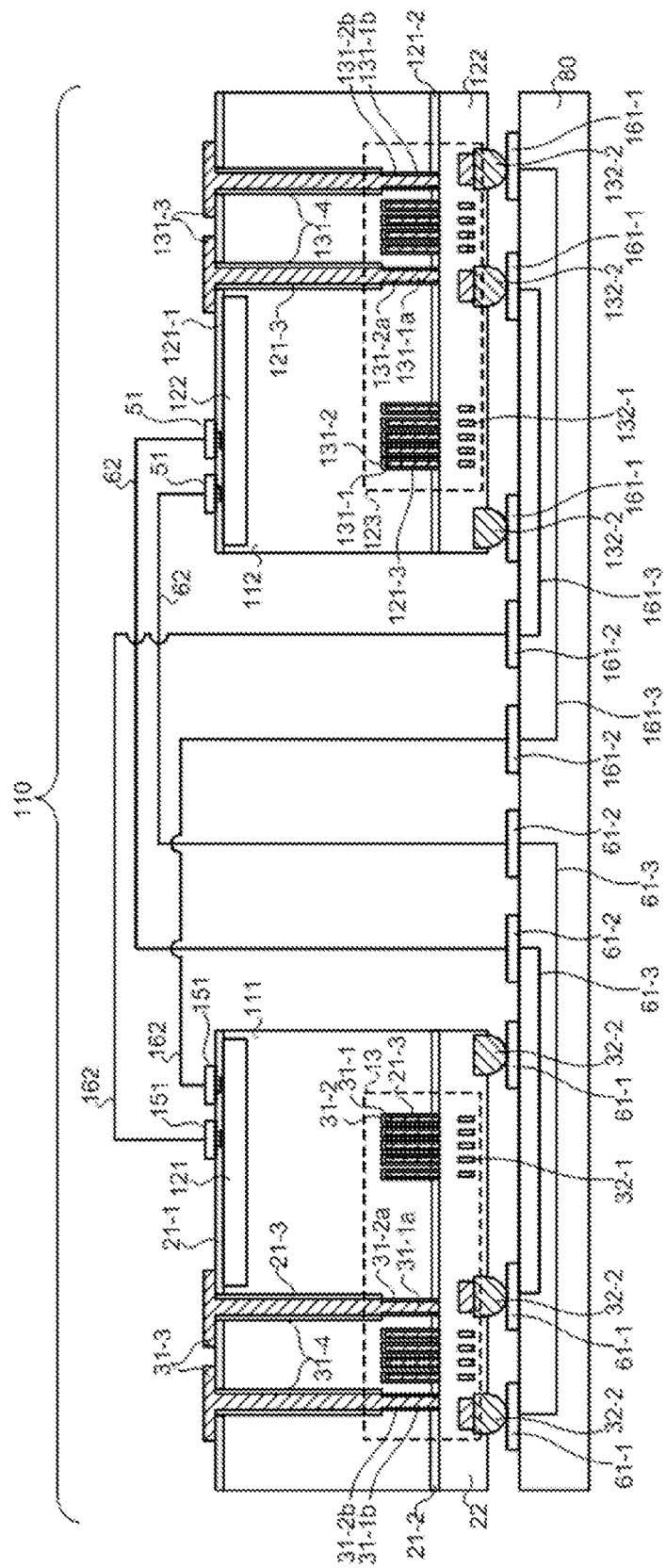
FIG. 17 is a schematic cross sectional view of the isolator according to the third embodiment.

The cross-sectional configuration of the isolator 10 will be described. A mounting example of the semiconductor substrate (hereinafter, transformer mounted chip) 20 that is depicted in FIG. 2 and in which the transmission circuit 12 and the transformer 13 are formed will be described. FIG. 13 is a schematic cross sectional view of the isolator according to the first embodiment. FIG. 14 is a schematic plan view of the isolator depicted in FIG. 13. In FIG. 13, depiction of the package encapsulation resin is omitted (similarly, in FIGS. 15 and 17 hereinafter, depiction of the packet encapsulation resin is omitted). In FIG. 13, depiction of the device architecture of the transmission circuit and the reception circuit is omitted (similarly, in FIGS. 15 and 17, depiction of the device architecture of the transmission circuit and the reception circuit is omitted). In FIG. 14, depiction of the transmission circuit and the terminals of the primary coil of the semiconductor substrate 20 as well as of the reception circuit of a semiconductor substrate 50 is omitted (similarly, in FIG. 18 hereinafter, depiction of the transmission circuit and the terminals of the primary coil of the semiconductor substrate, the transmission circuit, and the reception circuit is omitted).

As depicted in FIGS. 13 and 14, the isolator 10 has a configuration in which the transformer mounted chip 20 and the semiconductor substrate (hereinafter, signal reception chip) 50 in which the reception circuit (first drive circuit) 11 is formed are respectively mounted on a mounting substrate 60. The mounting substrate 60 is an insulating substrate having an anterior surface on which terminals 61-1 and 61-2 are disposed and a circuit pattern is formed. The reception circuit 11 is formed in an anterior surface of the signal reception chip 50, and a surface (posterior surface) thereof where the reception circuit 11 is not formed is regarded as the mounting substrate 60 side of the signal reception chip 50. The signal reception chip 50 is joined to the anterior surface of the mounting substrate 60. Terminals 51 of the reception circuit 11 are drawn to the anterior surface side of the signal reception chip 50.

A posterior surface (surface on the secondary coil 32-1 side) of the transformer mounted chip 20 is regarded as the mounting substrate 60 side and the transformer mounted chip 20 is mounted to the anterior surface of the mounting substrate 60. The bump electrodes 32-2 of the transformer mounted chip 20 are joined to terminals 61-1 of the mounting substrate 60. The terminals 61-1 connected to the secondary coil 32-1 via the bump electrodes 32-2 are further connected to other terminals 61-2 by wires 61-3 laid along the anterior surface of the mounting substrate 60. The other terminals 61-2 are connected to the terminals 51 of the signal reception chip 50 via bonding wires 62. In the isolator 10 having such a configuration, a signal transmitted from the transmission circuit 12 is input to the primary coil 31-1 of the transformer 13, via the terminals 31-3. The signal input to the primary coil 31-1 is input to the secondary coil 32-1 in an electrically isolated state and transmitted to the signal reception chip 50, via the bonding wires 62 electrically coupled to the bump electrodes 32-2.

As described, according to the first embodiment, a transmission circuit can be disposed at the anterior surface of a semiconductor substrate and a transformer configured by a primary coil and a secondary coil can be disposed at the entire posterior surface of the semiconductor substrate. Consequently, even if the transmission circuit and the transformer are disposed in a single semiconductor substrate, the semiconductor substrate can be reduced in size to a degree just fitting the outer most peripheries of the primary coil and the secondary coil configuring the transformer, thereby enabling a reduction in the size of the isolator.

Further, according to the first embodiment, the transformer is disposed in the posterior surface of the semiconductor substrate, thereby enabling a signal from the transmission circuit disposed in the anterior surface of the semiconductor substrate to be extracted from the posterior surface side of the semiconductor substrate. Consequently, the coil-induced magnetic effects on the transmission circuit disposed in the anterior surface of the semiconductor substrate can be reduced. The integration of the transmission circuit and the reception circuit in different semiconductor substrates (transformer mounted chip and signal reception chip) enables the occurrence of transmission circuit malfunctions consequent to dV/dt occurring at the reception circuit side to be suppressed. Further, since the transformer does not require magnetic bodies among the components, the transformer is not limited to the characteristics of operating frequency by the hysteresis of magnetic bodies and therefore, the electrical characteristics of the isolator can be improved.

According to the first embodiment, the primary coil is configured by a metal laminate film embedded inside a coil trench, thereby enabling the cross-sectional area of the primary coil to be increased according to the depth of the coil trench. Consequently, the DC resistance of the primary coil can be decreased and a large voltage gain can be obtained. Further, the primary coil is formed within a trench and the secondary coil is formed within an insulating film and consequently, the coils do not oppose one another at trench side walls, like a conventional transformer having coils formed in 2 trenches, respectively. Therefore, compared to a conventional transformer, the area of the portion where the primary coil and the secondary coil opposed one another can be reduced. Accordingly, parasitic capacitance between the primary coil and the secondary coil can be reduced, thereby enabling the delay of signal transmission from the transmission circuit to the reception circuit to be reduced. Accordingly, the electrical characteristics of the isolator can be improved. Further, according to the first embodiment, the thickness of the insulating film at the portion sandwiched by the primary coil and the secondary coil can be easily increased, thereby enabling high voltage tolerance to be facilitated.

Second Embodiment

FIG. 15 is a schematic cross sectional view of the isolator according to a second embodiment. The isolator 100 according to the second embodiment differs from the isolator according to the first embodiment in that the bump electrodes 32-2 of the transformer mounted chip 20 are directly connected to the terminals 51 of the reception circuit 11 of the signal reception chip 50. In other words, in the second embodiment, the connection of the secondary coil 32-1 disposed on the transformer mounted chip 20 and the reception circuit 11 disposed on the signal reception chip 50 does not use bonding wire.

The signal reception chip 50 is joined to an anterior surface of a mounting substrate 70 formed by the insulating substrate, a posterior surface thereof being regarded as the mounting substrate 70 side. The transformer mounted chip 20, with the posterior surface being regarded as the signal reception chip 50 side, is placed on the anterior surface of the signal reception chip 50. The bump electrodes 32-2 exposed at the posterior surface of the transformer mounted chip 20 are joined to the terminals 51 of the reception circuit 11, exposed at the anterior surface of the signal reception chip 50. The configurations of the transformer mounted chip 20 and the signal reception chip 50 are identical to those in the first embodiment. The entire configuration and all operation of a semiconductor device to which the isolator 100 is applied are identical to those of the first embodiment.

As described, according to the second embodiment, effects identical to those of the first embodiment can be obtained. Further, according to the second embodiment, since the isolator 100 can be fabricated using chip-on-chip (COC) technology, the size of the isolator 100 can be further reduced.

Third Embodiment

Figure 16:
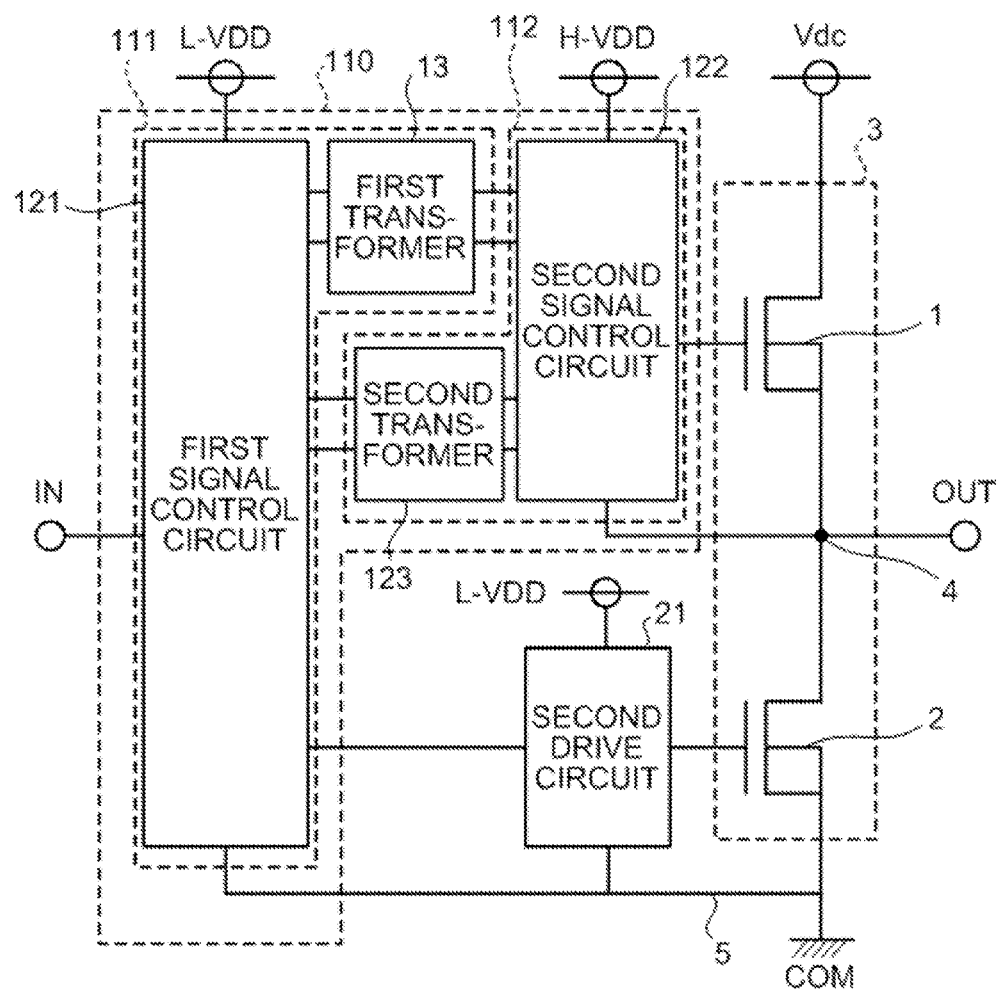
FIG. 16 is a block diagram of an example of an overall configuration of a semiconductor device to which the isolator according to a third embodiment is applied.

FIG. 16 is a block diagram of an example of an overall configuration of a semiconductor device to which the isolator according to a third embodiment is applied. An isolator 110 according to the third embodiment differs from the isolator according to the first embodiment on the following 2 points. The first difference is that in the basic circuit unit of the signal control circuit (hereinafter, first signal control circuit) 121, not just the transmission circuit, but also a reception circuit that receives a signal from another signal control circuit (hereinafter, second signal control circuit) 122 is configured therein. The second difference is that in place of the first drive circuit, the second signal control circuit 122 and a second transformer 123 are further included, and an upward level-shifting function and a downward level-shifting function are implemented by 2 transformers, the first and the second transformers 13, 123, disposed in the isolator 110.

As depicted in FIG. 16, the isolator 110 is configured by the first signal control circuit 121, the second signal control circuit 122, the first transformer 13, and the second transformer 123. The first signal control circuit 121 and the first transformer 13 are integrated in a first semiconductor substrate 111. The first signal control circuit 121 has a general device architecture such as, for example, an n-channel MOSFET. The basic circuit unit of the first signal control circuit 121 is configured by a transmission circuit for transmitting a signal to the second signal control circuit 122 and a reception circuit for receiving a signal from the second signal control circuit 122. Other configuration aspects of the first signal control circuit 121 are identical to those of the signal control circuit of the first embodiment. The first transformer 13 has a configuration identical to that of the transformer of the first embodiment and is disposed between the first signal control circuit 121 and the second signal control circuit 122. The first transformer 13 implements a level shifting (upward shifting) function of shifting the electrical potential level of a signal that is from the transmission circuit of the first signal control circuit 121 to the reception circuit of the high-side second signal control circuit 122.

On the other hand, the second signal control circuit 122 and the second transformer 123 are integrated in a second semiconductor substrate 112. The second signal control circuit 122 has a general device architecture of, for example, an n-channel MOSFET. The basic circuit unit of the second signal control circuit 122 is configured by a transmission circuit for transmitting a signal to the first signal control circuit 121 and a reception circuit for receiving a signal from the first signal control circuit 121. The reference potential of the second signal control circuit 122 is the electrical potential of the connection point 4 of the source of the first MOSFET 1 and the drain of the second MOSFET 2. The second transformer 123, similar to the first transformer 13, is configured by the primary coil (not depicted) and the secondary coil (not depicted), and is disposed between the first signal control circuit 121 and the second signal control circuit 122. The second transformer 123 implements a level shifting (downward shifting) function of shifting the electrical potential level of a signal that is from the transmission circuit of the first signal control circuit 121 to the reception circuit of the low-side second signal control circuit 122. The second transformer 123 uses magnetic field variations based on inductive coupling with the signal transmitter, to transmit in an electrically isolated state and to the first signal control circuit 121, a signal from the second signal control circuit 122. The configurations of the bridge circuit 3 and the second drive circuit 21 are identical to the respective configuration of the bridge circuit and the second drive circuit of the first embodiment.

Figure 18:
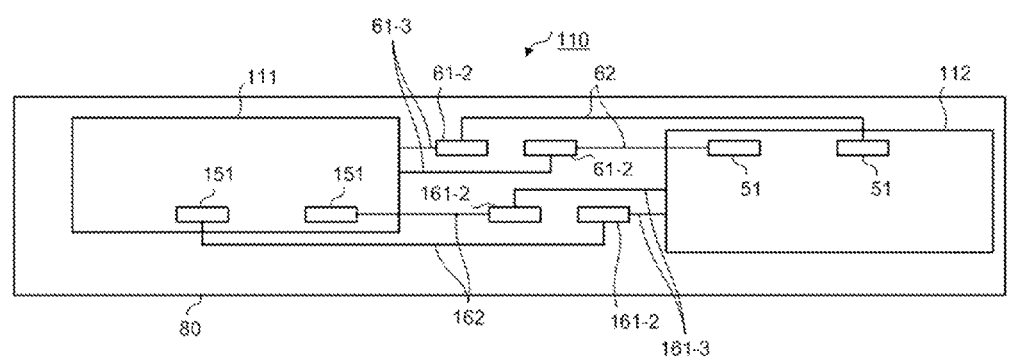
FIG. 18 is a schematic plan view of the isolator depicted in FIG. 17.

The cross-sectional configuration of the isolator 110 will be described. FIG. 17 is a schematic cross sectional view of the isolator according to the third embodiment. FIG. 18 is a schematic plan view of the isolator depicted in FIG. 17. As depicted in FIGS. 17 and 18, the isolator 110 has a configuration where the semiconductor substrate (first transformer mounted chip) 111 in which the first signal control circuit 121 and the first transformer 13 are formed, and the semiconductor substrate (second transformer mounted chip) 112 in which the second signal control circuit 122 and the second transformer 123 are formed, are respectively mounted on a mounting substrate 80. The mounting substrate 80 is an insulating substrate having an anterior surface in which the terminals 61-1, 61-2, 161-1 and 161-2 are disposed and a circuit pattern is formed.

In the first transformer mounted chip 111, terminals 151 of the reception circuit of the first signal control circuit 121 are drawn to the anterior surface side of the first transformer mounted chip 111. The primary coil 31-1 of the first transformer 13 is drawn to the anterior surface of the first transformer mounted chip 111 by the terminals 31-3 and is electrically coupled to the transmission circuit of the first signal control circuit 121. At the secondary coil 32-1 of the first transformer 13, the bump electrodes 32-2 that are exposed to the exterior of the insulating film 22 are formed. The bump electrodes 32-2 of the first transformer mounted chip 111 are joined to the terminals 61-1 of the mounting substrate 80. Other aspects of the configuration of the first signal control circuit 121 and the first transformer 13 are identical to those of the signal control circuit of the transformer mounted chip and the transformer of the first embodiment.

In the second transformer mounted chip 112, the configurations of the second signal control circuit 122 and the second transformer 123 are identical to the configurations of the first signal control circuit 121 and the first transformer 13 of the first transformer mounted chip 111. Specifically, similar to the first transformer mounted chip 111, a coil trench 131-2 and via trenches 131-4 are disposed in the second transformer mounted chip 112. In an oxide film 121-3 disposed along the side wall and bottom aspect of the coil trench 131-2 and the via trenches 131-4, a primary coil 131-1 and terminals 131-3 of the second transformer 123 are respectively disposed.

The primary coil 131-1 of the second transformer 123 is drawn to the anterior surface of the second transformer mounted chip 112 by the terminals 131-3 and are electrically coupled to the transmission circuit of the second signal control circuit 122. Inside an insulating film 122 covering the primary coil 131-1 of the second transformer 123, a secondary coil 132-1 of the second transformer 123 is disposed opposing the primary coil 131-1. At the primary coil 131-1 of the second transformer 123, bump electrodes 132-2 are formed exposed to the exterior of the insulating film 122. The bump electrodes 132-2 of the second transformer mounted chip 112 are joined to terminals 161-1 of the mounting substrate 80. The terminals 51 of the reception circuit of the second signal control circuit 122 are drawn to the anterior surface side of the second transformer mounted chip 112.

The terminals 61-1 and 161-1 of the mounting substrate 80 are connected to the other terminals 61-2 and 161-2 of the mounting substrate 80, respectively, by the wires 61-3 and 161-3 laid along the anterior surface of the mounting substrate 80. The terminals 61-2 of the mounting substrate 80 are connected to the terminals 51 of the reception circuit of the second transformer mounted chip 112, via the bonding wires 62. The terminals 161-2 of the mounting substrate 80 are connected to terminals 151 of the reception circuit of the first transformer mounted chip 111, via the bonding wires 162.

In the isolator 110 configured as such, a signal transmitted from the first signal control circuit 121 is input to the primary coil 31-1 of the first transformer 13, via the terminals 31-3. The signal input to the primary coil 31-1 of the first transformer 13 is input in an electrically isolated state, to the secondary coil 32-1 of the first transformer 13 and is transmitted to the reception circuit of the second signal control circuit 122, via the bonding wires 62 electrically coupled to the bump electrodes 32-2. At this time, the signal transmitted from the first signal control circuit 121 is adjusted to the DC electrical potential of the high-side second signal control circuit 122, by being transmitted through the first transformer 13.

On the other hand, a signal transmitted from the second signal control circuit 122 is input to the primary coil 131-1 of the second transformer 123, via the terminals 131-3. The signal input to the primary coil 131-1 of the second transformer 123 is input in an electrically isolated state, to the secondary coil 132-1 of the second transformer 123 and is transmitted to the reception circuit of the first signal control circuit 121, via bonding wires 162 electrically coupled to the bump electrodes 132-2. At this time, the signal transmitted from the second signal control circuit 122 is adjusted to the CD electrical potential of the low-side first signal control circuit 121, by being transmitted through the first transformer 13.

As described above, according to the semiconductor device of the third embodiment, the effects identical to those of the semiconductor device according to the first embodiment can be obtained.

In some embodiments of the present invention, without limitation to the embodiments above, the number of turns, the dimensions, etc. of the primary coil and the secondary coil can be varied according to the configuration of the isolator. Further, although description has been given using a p-type semiconductor substrate, an n-type semiconductor substrate, a semiconductor substrate of a material other than silicon, etc. can also be adopted.

As described above, among electronic devices that are controlled by high voltage such as industrial and medical devices, the isolator and the isolator manufacturing method according to the present invention are useful for power semiconductor devices requiring assured electrical isolation.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

What is claimed is:

1. An isolator comprising
a transmission circuit disposed in a first principal surface of a first semiconductor substrate; and
a transformer that has a configuration where a primary coil electrically coupled to the transmission circuit and a secondary coil electrically coupled to a reception circuit oppose one another in an electrically isolated state, and that transmits in an electrically isolated state and to the reception circuit, a signal of the transmission circuit,
wherein the transformer is disposed in a second principal surface side of an area that is of the first semiconductor substrate and in which the transmission circuit is disposed.

2. The isolator according to claim 1, further comprising:
a trench disposed in the second principal surface of the first semiconductor substrate;
an oxide film disposed along a side wall and bottom aspect of the trench;
the primary coil configured by a metal film embedded in the oxide film inside the trench and exposed at the second principal surface of the first semiconductor substrate;
an insulating film covering the primary coil; and
the secondary coil configured by a metal film that is disposed inside the insulating film, opposing the primary coil and electrically isolated from the primary coil by the insulating film.

3. The isolator according to claim 1, further comprising:
via holes that reach a trench from the first principal surface of the first semiconductor substrate,
wherein the transmission circuit and the primary coil are electrically coupled by a metal film embedded in the via holes.

4. The isolator according to claim 1, further comprising bump electrodes disposed at the second coil,
wherein the first semiconductor substrate is mounted via the bump electrodes.

5. The isolator according to claim 1, further comprising:
the reception circuit that receives the signal from the transmission circuit, wherein the reception circuit is disposed in a second semiconductor substrate that is different from the first semiconductor substrate.

6. An isolator comprising:
a first transmission circuit disposed in a first principal surface of a first semiconductor substrate;
a second transmission circuit disposed in a first principal surface of a second semiconductor substrate;
a first reception circuit that is disposed in the first principal surface of the first semiconductor substrate and that receives a signal from the second transmission circuit;
a second reception circuit that is disposed in the first principal surface of the second semiconductor substrate and that receives a signal from the first transmission circuit;
a first transformer that has a configuration where a primary coil electrically coupled to the first transmission circuit and a secondary coil electrically coupled to the second reception circuit opposed one another in an electrically isolated state, and that shifts the electrical potential level of the signal from the first transmission circuit to the second reception circuit; and
a second transformer that has a configuration where a primary coil electrically coupled to the second transmission circuit and a secondary coil electrically coupled to the first reception circuit opposed one another in an electrically isolated state, and that shifts the electrical potential of a signal from the second transmission circuit to the first reception circuit,
wherein the first transformer is disposed at a second principal surface side of an area that is of the first semiconductor substrate and in which the first transmission circuit is disposed, and
wherein the second transformer is disposed at a second principal surface side of an area that is of the second semiconductor substrate and in which the second transmission circuit is disposed.

7. An isolator manufacturing method comprising:
forming a transmission circuit in a first principal surface of a semiconductor substrate;
forming a trench in a second principal surface of the semiconductor substrate, at an area in which the transmission circuit is formed;
forming an oxide film along a side wall and bottom aspect of the trench;
embedding a first metal film in the oxide film inside the trench, so as to be exposed at the second principal surface of the semiconductor substrate;
forming an insulating film on the second principal surface of the semiconductor substrate, so as to cover the first metal film; and
forming in the insulating film, a second metal film that opposes the first metal film and that is electrically isolated from the first metal film by the insulating film.

8. The isolator manufacturing method according to claim 7, wherein the forming of the trench includes forming via holes that reach the trench from the first principal surface of the semiconductor substrate,
the forming of the oxide film includes forming the oxide film along a side wall of the via holes, and
the embedding of the first metal film includes embedding the first metal film in the oxide film inside the via holes.

9. The isolator manufacturing method according to claim 8, wherein the embedding of the first metal film includes simultaneously embedding the first metal film inside the via holes and inside the trench.

10. The isolator manufacturing method according to claim 7, wherein the embedding of the first metal film includes forming the first metal film by electroplating processing.

11. The isolator manufacturing method according to claim 7, wherein the forming of the second metal film includes forming the second metal film by electroplating processing.

12. An isolator comprising
a transmission circuit disposed in a first principal surface of a first semiconductor substrate;
a transformer disposed in a second principal surface side of an area that is of the first semiconductor substrate and in which the transmission circuit is disposed, wherein the transformer includes a primary coil configured by a first metal film disposed in the second principal surface of the first semiconductor substrate via an oxide film; an insulating film covering the primary coil; and a secondary coil configured by a second metal disposed in inside the insulating film opposing the primary coil and electrically isolated from the primary coil by the insulating film; and an electrode electrically connected to the secondary coil, and exposed to a surface of the insulating film in the opposite side to the primary coil, the electrode electrically coupling the secondary coil to a reception circuit that receives signals from the transmission circuit.

\* \* \* \* \*